US008610512B2

(12) United States Patent
Michel et al.

(10) Patent No.: US 8,610,512 B2
(45) Date of Patent: Dec. 17, 2013

(54) SYNTHESIZER OF AN OSCILLATING SIGNAL

(75) Inventors: Jean-Philippe Michel, Fontaine (FR); Michaël Quinsat, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 89 days.

(21) Appl. No.: 13/451,913

(22) Filed: Apr. 20, 2012

(65) Prior Publication Data

US 2012/0268214 A1   Oct. 25, 2012

(30) Foreign Application Priority Data

Apr. 20, 2011 (FR) ...................................... 11 53425

(51) Int. Cl.
*H03B 5/00* (2006.01)
(52) U.S. Cl.
USPC ....... 331/96; 331/94.1; 360/324; 360/324.12; 257/421
(58) Field of Classification Search
USPC ........ 331/94.1, 96; 257/421; 360/324, 342.12
See application file for complete search history.

(56) References Cited

U.S. PATENT DOCUMENTS

| 5,695,864 A | 12/1997 | Slonczewski |
| 2011/0051481 A1 | 3/2011 | Maehara |
| 2011/0280340 A1* | 11/2011 | Pasanen et al. ............... 375/300 |
| 2013/0057357 A1* | 3/2013 | Houssameddine et al. ... 331/177 R |

FOREIGN PATENT DOCUMENTS

| EP | 1 860 769 | 11/2007 |
| FR | 2817998 | 6/2002 |
| FR | 2 892 871 | 5/2007 |
| FR | 957888 | 11/2009 |

OTHER PUBLICATIONS

B. Georges et al, "Coupling efficiency for phase locking of a spin transfer nano-oscillator to a microwave current", Physical Review Letters, vol. 101, n°1, Jan. 7, 2008.
Baibich, M., Broto, J.M., Fert, A., Nguyen Van Dau, F., Petroff, F., Etienne, P., Creuzet, G., Friederch, A. and Chazelas, J., "*Giant magnetoresistance of (001)Fe/(001)Cr magnetic superlattices*", Phys.Rev.Lett., 61 (1988) 2472).
Katine, J.A., Albert, F.J., Buhrman, R.A., Myers, E.B., and Ralph, D.C., "*Current-Driven Magnetization Reversal and Spin-Wave Excitations in Co /Cu /Co Pillars*", Phys.Rev.Lett. 84, 3149 (2000)).

(Continued)

*Primary Examiner* — Arnold Kinkead
(74) *Attorney, Agent, or Firm* — Occhiuti & Rohlicek LLP

(57) ABSTRACT

A synthesizer includes a second frequency-synthesizing stage comprising a radiofrequency oscillator configured to oscillate at a frequency $\alpha fo$ when it is synchronized with a signal $s0(t)$, where $\alpha$ is a rational number different from one such that $\alpha f0=ft$. The radiofrequency oscillator has a magnetoresistive device within which there flows a spin-polarized electrical current to generate a signal $st(t)$ oscillating at the frequency $ft$ on an output electrode connected to the rendering terminal. This device is formed by a stack of magnetic and non-magnetic layers, a synchronization terminal for synchronizing the frequency of the oscillating signal $st(t)$ with the frequency of the signal received at the synchronization terminal. The synchronization terminal being connected to the output terminal of the first stage to receive the signal $s0(t)$.

10 Claims, 2 Drawing Sheets

(56) References Cited

OTHER PUBLICATIONS

Kiselev, S.I., Sankey, J.C., Krivorotov, LN., Emley, N.C., Schoelkopf, R.J., Buhrman, R.A., and Ralph, D.C., "*Microwave oscillations of a nanomagnet driven by a spin-polarized current*", Nature, 425, 380 (2003)).

Moodera, JS., Kinder, LR., Wong, TM. and Meservey,R. "*Large magnetoresistance at room temperature in ferromagnetic thin film tunnel junctions*", Phys.Rev.Lett 74, (1995) 3273-6).

Sergei Urazhdin and Phillip Tabor, "*Fractional synchronization of spin-torque nano-oscillators*", Physical Review Letters, PRL 105, 104101, Sep. 3, 2010.

Slavin and V. Tiberkevich, "*Nonlinear auto-oscillator theory of microwave generation by spin-polarized current*" IEEE Transaction on Magnetics, vol. n°45, pp. 1875-1918(2009).

W. Rippard et al, "Injection locking and phase control of spin transfer nano-oscillators", Physical Review Letters, vol. 95, n°6, Jan. 8, 2005.

Zarudniev M et al, "Spin torque oscillator characteristics in coupled networks", Hardware and software implementation and control of distributed mems (DMEMS), 2010, First Workshop on, IEEE, Piscataway, NJ, USA, Jun. 28, 2010, pp. 20-23.

M. Quinsat et al., "*Amplitude and phase noise of magnetic tunnel junction oscillators*." Applied Physics Letters 97, 182507 (2010).

\* cited by examiner

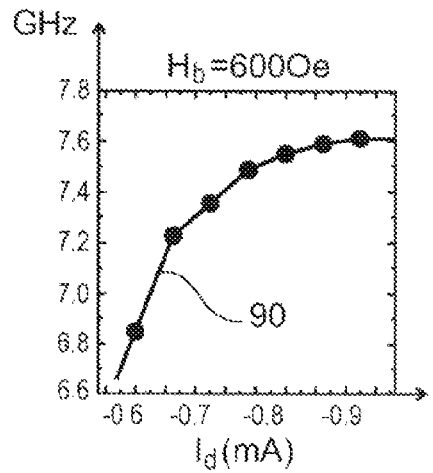
Fig. 4
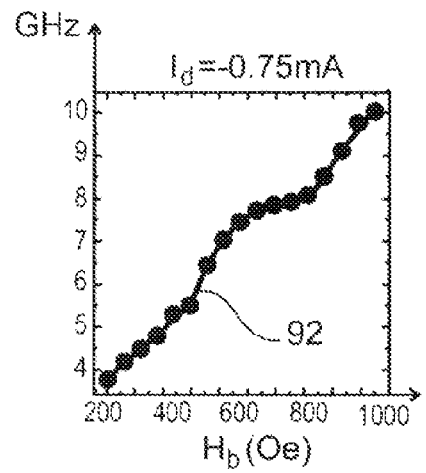
Fig. 5
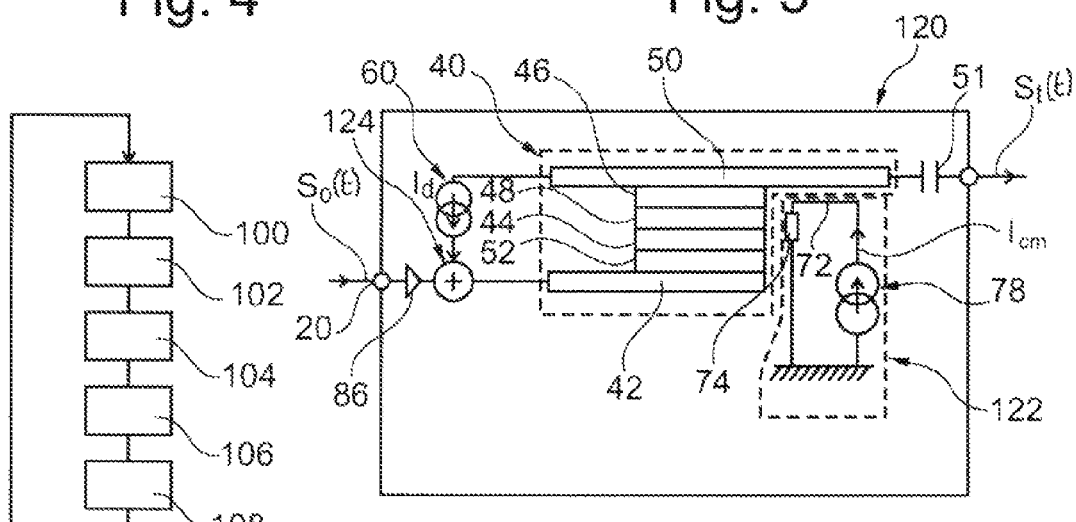
Fig. 6
Fig. 7
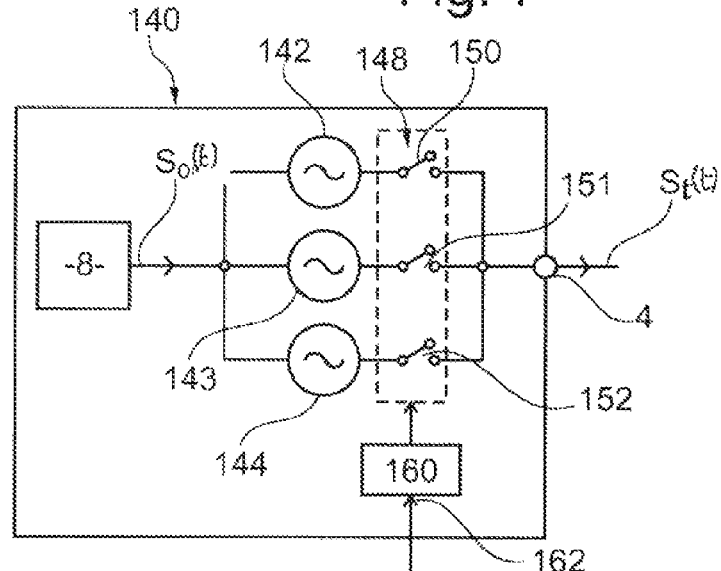
Fig. 8

SYNTHESIZER OF AN OSCILLATING SIGNAL

RELATED APPLICATIONS

Under 35 USC 119, this application claims the benefit of the priority date of French Patent Application 1153425, filed Apr. 20, 2011, the contents of which are herein incorporated by reference.

FIELD OF DISCLOSURE

The invention pertains to a synthesizer of an oscillating signal and to a method for synthesizing an oscillating signal $s_t(t)$ oscillating at a frequency $f_t$.

BACKGROUND

Known frequency synthesizers generally comprise:
a first frequency-synthesizing stage capable of generating, at an output terminal, a signal $s_0(t)$ oscillating at a frequency $f_0$, this first stage comprising a phase-locked loop,
a rendering terminal at which the signal $s_t(t)$ oscillating at the frequency $f_t$ is rendered.

The drawback of known synthesizers, such as those comprising voltage-controlled oscillators (VCOs) feed-back controlled in a phase-locked loop is that their space requirement is often great.

Moreover, telecommunications systems often rely on the use of different carrier frequencies modulated by pieces of information to be transmitted. Each standardized system uses its own carrier frequency or frequencies. A communications apparatus capable of being used in different telecommunications systems must therefore be capable of generating signals oscillating at different carrier frequencies. Now, one and the same synthesizer of little space requirement cannot produce the different carrier frequencies required to work in the different telecommunications systems. Such a synthesizer is said to have limited spectral agility because it cannot produce a signal oscillating at frequencies stretching over a range of several gigahertz. It is therefore necessary to use several distinct synthesizers in the same telecommunications apparatus. Each distinct synthesizer is configured to generate frequencies on a predetermined range different from those generated by the other synthesizers.

The following are also known from the prior art:
Sergei Urazhdin et al, "Fractional synchronization of spin-torque nano-oscillator", Physical Review Letters, vol. 105, n° 10, Aug. 1, 2010,
B. Georges et al, "Coupling efficiency for phase locking of a spin transfer nano-oscillator to a microwave current", Physical Review Letters, vol. 101, n° 1, Jan. 7, 2008,
W. Rippard et al, "Injection locking and phase control of spin transfer nano-oscillators", Physical Review Letters, vol. 95, n° 6, Jan. 8, 2005,
Zarudniev M et al, "Spin torque oscillator characteristics in coupled networks", Hardware and software implementation and control of distributed mems (DMEMS), 2010, First Workshop on, IEEE, Piscataway, N.J., USA, Jun. 28, 2010, pages 20-23,
US2011/051481A1.

The invention seeks to overcome at least one of these drawbacks.

SUMMARY OF THE INVENTION

An object of the invention therefore is a synthesizer of an oscillating signal $s_t(t)$ in which the synthesizer also comprises a second frequency-synthesizing stage comprising a radiofrequency oscillator comprising:
a magnetoresistive device within which there flows a spin-polarized electrical current to generate a signal $s_t(t)$ oscillating at the frequency $f_t$ on an output electrode connected to the rendering terminal, this device being formed by a stack of magnetic and non-magnetic layers,
a synchronization terminal for synchronizing the frequency of the oscillating signal $s_t(t)$ with the frequency of the signal received at this terminal, this terminal being connected to the output terminal of the first stage to receive the signal $s_0(t)$, and
a current source to make a continuous current of electrons flow in said layers perpendicularly to these layers or a magnetic field generator capable of generating a continuous magnetic field for which the field lines cross a free layer of the magnetoresistive device with an intensity greater than or equal to 1 Oe, the direct current source and/or the continuous magnetic field generator being set so that the radiofrequency oscillator oscillates:
at a frequency $\alpha f_o$ when it is synchronized with the signal $s_0(t)$, where a is a positive rational number different from 1 such that $\alpha f_0 = f_t$, and
at a free frequency $f_{lo}$ equal to the frequency $f_t$ to within ±60% when there is no signal at the synchronization terminal of the radiofrequency oscillator.

This synthesizer is more compact than the known synthesizer because it uses a magnetoresistive device to generate the signal $s_t(t)$ oscillating at the frequency $f_t$. Indeed, such magnetoresistive devices have dimensions far smaller than one micrometer. More specifically, the magnetoresistive device reduces the space requirement of the synthesizer relatively to the known synthesizer equipped with a phase-locked loop directly generating the signal $s_t(t)$ at the frequency $f_t$. For example, the magnetoresistive device makes it possible to divide the frequency $f_0$ coming from the phase-locked loop so as to bring it to the frequency $f_t$. Now, a first frequency stage, comprising a voltage-controlled oscillator feed-back controlled in a phase-locked loop and working at a frequency $f_0$ higher than the frequency $f_t$ has a smaller space requirement. Indeed, the constituent elements of the first synthesis stage, such as an inductor, are all the less bulky as the frequency $f_0$ is high. This means that the space requirement of a first synthesis stage working at a frequency $f_0$ strictly greater than the frequency $f_t$ and that of a magnetoresistive device is smaller than the space requirement of a voltage-controlled oscillator feed-back controlled in a phase-locked loop working at the frequency $f_t$.

Furthermore, the presence of the radiofrequency oscillator improves the spectral agility of the synthesizer. Indeed, by playing on the settings of the radiofrequency oscillator, it is possible to modify the coefficient $\alpha$ and therefore to make the frequency $f_t$ vary over a wide range of frequencies.

The embodiments of this synthesizer may comprise one or more of the following characteristics:
the first stage is configured to generate the signal $s_0(t)$ oscillating at a frequency $f_0$ strictly greater than the frequency $f_t$ and, preferably, at a frequency $f_0 \geq 2 f_t$;
the synthesizer has a electronic control unit capable of modifying the setting of the direct current source and/or the continuous magnetic field so that the frequency of the signal $s_t(t)$ when the radiofrequency oscillator is synchronized with the signal $s_0(t)$ of a same frequency $f_0$ passes from a frequency $\alpha_1 f_0$ to a frequency $\alpha_2 f_0$, where $\alpha_1$ and $\alpha_2$ are different rational numbers;
the second stage comprises:

several radiofrequency oscillators for which the synchronization terminals are connected to the same output terminal of the first stage to receive the same signal $s_0(t)$, each radiofrequency oscillator being configured to oscillate at a free frequency $f_{lo}$, when there is no signal at the synchronization terminal, different from those of the other radiofrequency oscillators so that, when this radiofrequency oscillator is synchronized with the signal $s_0(t)$, the signal $s_t(t)$ that it produces oscillates at a frequency $\alpha f_0$ with a coefficient $\alpha$ proper to this radiofrequency oscillator, and a set of controllable switches capable of connecting, in alternation, the output electrode of any one of the radiofrequency oscillators with the rendering terminal, and a electronic control unit capable, as a function of the instructions received at a control terminal, of controlling the set of switches to connect, to the rendering terminal, the output electrode of the radiofrequency oscillator or oscillators which produce a signal oscillating at the frequency $f_t$ corresponding to the instructions received;

the stack of layers of the magnetoresistive device comprises at least the following layers:

an input electrode by which the direct electrical current is injected, a first magnetic layer, called a "reference layer", capable of spin-polarizing the electrical current, and the magnetization of which has a fixed direction, a second magnetic layer, called a "free layer", the magnetization of which can oscillate when it is crossed by the spin-polarized current, a non-magnetic layer, called a spacer, interposed between the two preceding layers to form a tunnel junction or a spin valve, and the output electrode at which there is produced the signal oscillating at an oscillation frequency $s(t)$ as a function of the intensity of the direct current or of the amplitude of a continuous magnetic wave, the field lines of which cross the free layer, the cross-section of at least one of the layers of the stack having a diameter of less than 300 nm;

the generator is capable of modifying the direction of the continuous magnetic field as a function of a command and the synthesizer has a, electronic control unit capable of generating said command as a function of a value of the frequency $f_t$ desired by a user.

These embodiments of the synthesizer furthermore have the following advantages:

the use of a first stage generating the signal $s_0(t)$ at a frequency $f_0$ strictly higher than the frequency $f_t$ reduces the space requirement of the synthesizer;

the presence of an electronic control unit capable of modifying the setting of the radiofrequency oscillator increases the spectral agility of the synthesizer;

the presence of an electronic control unit to connect, in alternation, a particular preset radiofrequency oscillator to the rendering terminal increases the spectral agility of the synthesizer;

the use of a magnetic field generator capable of modifying the direction of the continuous magnetic field in response to a command also increases the spectral agility of the synthesizer.

An object of the invention is also a method for synthesizing a signal $s_t(t)$ oscillating at a frequency $f_t$, this method comprising:

the generation by a first synthesizing stage, at an output terminal, of a signal $s_0(t)$ oscillating at a frequency $f_0$, this first stage comprising a phase-locked loop, the rendering at a rendering terminal of the signal $s_t(t)$ oscillating at the frequency $f_t$.

This method also comprises the synchronization of a radiofrequency oscillator with the signal $s_0(t)$, this radiofrequency oscillator comprising:

a magnetoresistive device within which there flows a spin-polarized electrical current to generate a signal $s_t(t)$ oscillating at the frequency $f_t$ on an output electrode connected to the rendering terminal, this device being formed by a stack of magnetic and non-magnetic layers, a synchronization terminal for synchronizing the frequency of the oscillating signal $s_t(t)$ with the frequency of the signal received at this terminal, this terminal being connected to the output terminal of the first stage to receive the signal $s_0(t)$, and a current source to make a continuous current of electrons flow in said layers perpendicularly to these layers or a magnetic field generator capable of generating a continuous magnetic field for which the field lines cross the free layer with an intensity greater than or equal to 1 Oe, the direct current source and/or the continuous magnetic field generator being set so that the radiofrequency oscillator oscillates:

at a frequency $\alpha f_o$ when it is synchronized with the signal $s_0(t)$, where $\alpha$ is a positive rational number different from 1 such that $\alpha f_0 = f_t$, and at a free frequency $f_{lo}$ equal to the frequency $f_t$ to within ±60% when there is no signal at the synchronization terminal of the radiofrequency oscillator.

The embodiments of this method may comprise one or more of the following characteristics:

the continuous current and/or continuous magnetic field are set so that the free frequency $f_{lo}$ of oscillation of the oscillating signal produced when there is no signal at the synchronization terminal of the radiofrequency oscillator is equal to the frequency $f_t$ to within ±45%;

the electrical signal $s_0(t)$ is amplified so that its amplitude at the synchronization terminal is greater than 10% of the intensity of the continuous current or corresponds to an alternating magnetic field whose intensity is greater than 1 Oe within the free layer when it is converted into a magnetic field by a generator.

BRIEF DESCRIPTION OF THE DRAWINGS

The invention will be understood more clearly from the following description, given purely by way of a non-restrictive example and made with reference to the appended drawings of which:

FIGS. 4 and 5 are graphs illustrating the performance of a magnetoresistive device used to make the second stage of FIG. 3;

FIG. 6 is a flowchart of a method of operation of the synthesizer of FIG. 1;

FIG. 7 is a schematic illustration of another embodiment of the second stage of FIG. 3, and FIG. 8 is a schematic illustration of another embodiment of a synthesizer of the oscillating signal $s(t)$.

In these figures, the same references are used to designate the same elements.

DETAILED DESCRIPTION

Here below in this description, the characteristics and functions well known to those skilled in the art are not described in detail.

Figure 1:
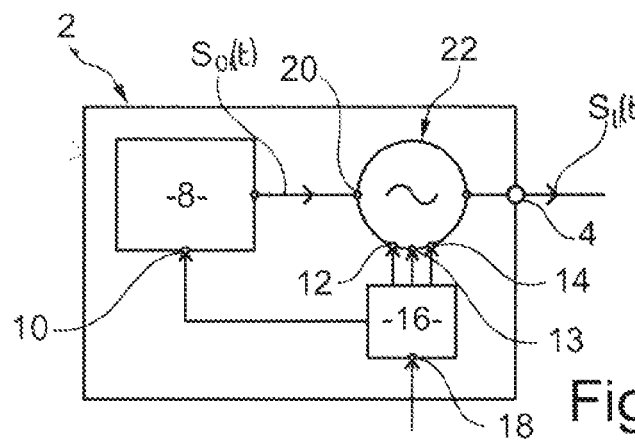
FIG. 1 is a schematic illustration of a synthesizer of a signal $s_t(t)$ oscillating at a frequency $f_t$.

FIG. 1 shows a frequency synthesizer 2. More specifically, the synthesizer 2 generates a signal $s_t(t)$ oscillating at a frequency $f_t$. Typically, the signal $s_t(t)$ is a radiofrequency signal, the frequency $f_t$ of which ranges from 100 MHz to 60 or 120 GHz. Preferably, the frequency $f_t$ ranges from 700 MHz to 40 GHz.

The synthesizer 2 renders the signal $s_t(t)$ at the terminal 4. It comprises:
a first stage 8 for synthesizing a signal $s_0(t)$ oscillating at a frequency $f_0$, and
a second stage 22 for synthesizing the signal $s_t(t)$ from the signal $s_0(t)$.

Typically, the signal $s_0(t)$ has a good phase noise. The term "phase noise" herein designates the ratio between the power of the carrier and the noise power contained in a one Hz band at a distance $f_f$ from the carrier. The phase noise is expressed in dBc/Hz by:

$$L_\phi(f_f) = 10 \cdot \log(S_\phi(f_f)/2)$$

where:
$S_\phi(f_f)$ is the spectral density of the phase noise.

The term "good phase noise" designates a phase noise $L_\phi$ smaller than or equal to −50 dBc/Hz at a distance 10 kHz from the carrier and −90 dBc/Hz at 10 MHz and preferably smaller than or equal to −70 dBc/Hz at 10 kHz from the carrier, and to −110 dBc/Hz at 10 MHz.

Here, this first stage 8 has a terminal 10 for setting the frequency $f_0$ of the signal $s_0(t)$.

The second stage 22 is made by means of a radiofrequency oscillator carrying the same numerical reference. This radiofrequency oscillator generates the signal $s_t(t)$ in phase with the signal $s_0(t)$ when it is synchronized with this signal $s_0(t)$. Under these conditions, the frequency $f_t$ is given by the following relationship: $f_t = \alpha f_0$, where the coefficient $\alpha$ is a rational number.

Here, the oscillator 22 can be set by means of three setting terminals 12 to 14. These setting terminals make it possible especially to modify the value of the coefficient $\alpha$.

Finally, the synthesizer 2 also has an electronic control unit 16. This electronic unit is connected to the setting terminals 10 and 12 to 14 so as to cause the frequency $f_t$ of the signal $s_t(t)$ to vary as a function of instructions received at a control terminal 18.

Figure 2:
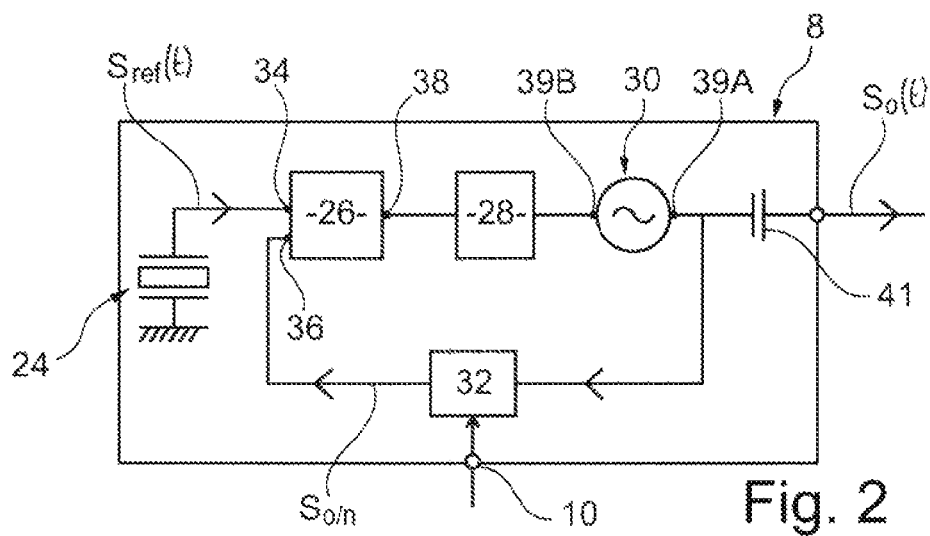
FIG. 2 is a schematic illustration of a first stage for synthesizing a frequency $f_0$ of the synthesizer of FIG. 1.

FIG. 2 shows a particular embodiment of a first stage 8. In this embodiment, the first stage 8 is a synthesis stage comprising a voltage-controlled oscillator feed-back controlled in a phase-locked loop. Phase-locked loops are well known. Thus, only the main elements of the stage 8 are shown in FIG. 2.

The stage 8 comprises:
a reference clock 24,
a phase comparator 26,
a low-pass filter 28,
a voltage-controlled oscillator 30, and
a frequency divider 32.

The clock 24 generates an oscillating reference signal $s_{ref}(t)$ at a frequency $f_{ref}$. Typically, the frequency $f_{ref}$ is smaller than 100 MHz. Here, this frequency $f_{ref}$ is also greater than 1 MHz. For example, the frequency $f_{ref}$ is equal to 10 MHz or 27 MHz.

The phase noise of the clock 24 is excellent, i.e. it is smaller than or equal to −120 dBc/Hz at 10 kHz from the carrier, and preferably smaller than or equal to −150 dBc/Hz at 10 kHz from the carrier.

For example, here, the reference clock 24 is made by means of a quartz crystal.

The comparator 26 is equipped with two inputs 34 and 36. The input 34 is connected to the clock 24 to receive the signal $s_{ref}(t)$. This comparator 26 produces, at an output 38, a voltage as a function of the difference between the phases of the signals received at its inputs 34 and 36.

The filter 28 filters the voltage produced at the output 38.

The oscillator 30 is better known as a VCO (voltage-controlled oscillator). The oscillator 30 generates the signal $s_0(t)$ at an output 39A. The frequency of the signal $s_0(t)$ is proportional to the voltage received at an input 39B of this oscillator 30. Here, the frequency $f_0$ is equal to $nf_{ref}$, where n is a natural integer.

The input 39B is connected to the output of the filter 28 to receive the filtered voltage. The output 39A is connected to a synchronization terminal 20 (FIG. 1) of the oscillator 22 by means of a capacitor 41. The capacitor 41 eliminates every continuous component of the signal $s_0(t)$.

The output 39A is also connected to the input 36 of the phase comparator 26 by means of a feedback loop known as a phase-locked loop. This feedback loop comprises the frequency divider 32. The divider 32 is capable of dividing the frequency of the signal $s_0(t)$ by a factor n to produce a signal $s_{0/n}(t)$ injected into the input 36. The frequency of the signal $s_{0/n}(t)$ is equal to the frequency $f_0/n$.

In this embodiment, the factor n can be set by means of the setting terminal 10. This modifies the frequency $f_0$ by frequency steps $f_{ref}$.

Figure 3:
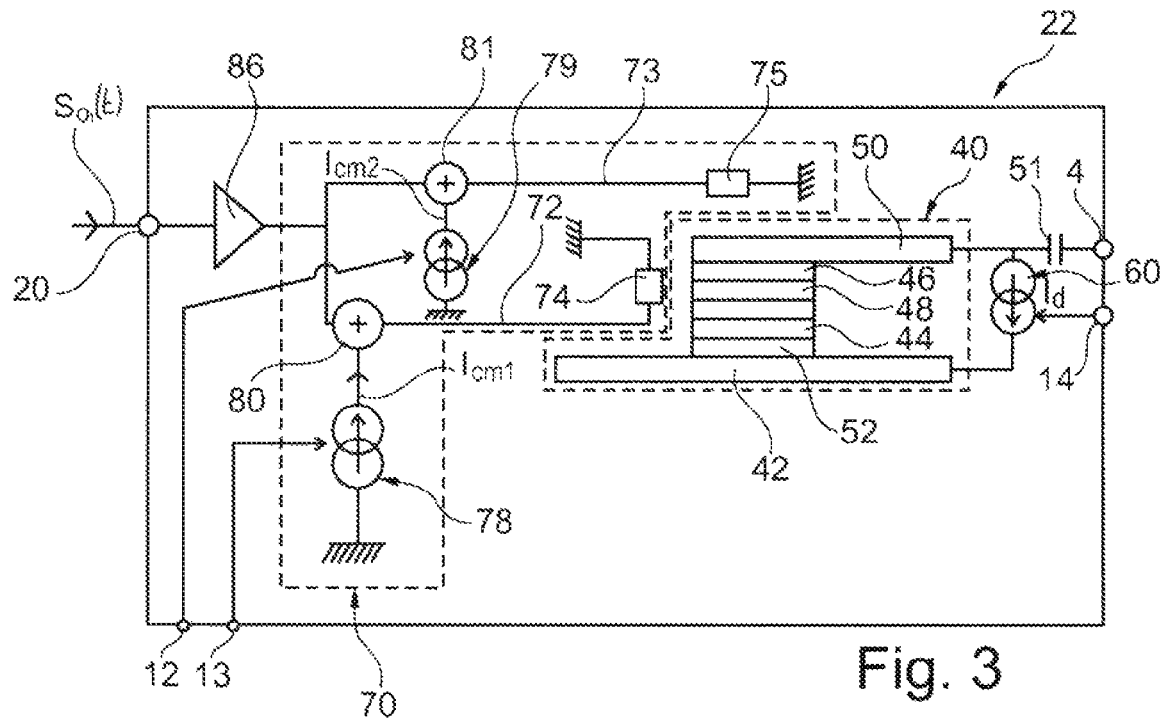
FIG. 3 is a schematic illustration of a second stage for synthesizing the frequency $f_t$ of the synthesizer of FIG. 1.

FIG. 3 gives a more detailed view of an example of an embodiment of the oscillator 22. This oscillator 22 is derived from spin electronics.

Spin electronics uses the spin of electrons as an additional degree of freedom in order to generate novel effects. The spin polarization of an electrical current results from the asymmetry existing between the spin-up type polarization of the conduction electrons (i.e. polarization parallel to the local magnetization) and the spin-down type polarization (i.e. polarization anti-parallel to the local magnetization). This asymmetry leads to an asymmetry in the conductivity between the two channels, namely the spin-up and spin-down channels, giving rise to a distinct spin polarization of the electrical current.

This spin polarization of the current is the source of magnetoresistive phenomena in magnetic multilayers such as giant magnetoresistance (Baibich, M., Broto, J. M., Fert, A., Nguyen Van Dau, F., Petroff, F., Etienne, P., Creuzet, G., Friederch, A. and Chazelas, J., "*Giant magnetoresistance of (001)Fe/(001)Cr magnetic superlattices*", Phys. Rev. Lett., 61 (1988) 2472), or tunnel magnetoresistance (Moodera, J S., Kinder, L R., Wong, T M. and Meservey, R. "*Large magnetoresistance at room temperature in ferromagnetic thin film tunnel junctions*", Phys. Rev. Lett 74, (1995) 3273-6).

Furthermore, it has also been observed that, by making a spin-polarized current cross a thin magnetic layer, it is possible to induce a reversal of its magnetization when there is no external magnetic field (Katine, J. A., Albert, F. J., Buhrman, R. A., Myers, E. B., and Ralph, D. C., "*Current-Driven Magnetization Reversal and Spin-Wave Excitations in Co/Cu/Co Pillars*", Phys. Rev. Lett. 84, 3149 (2000)).

Polarized current can also generate sustained magnetic excitations, also known as oscillations (Kiselev, S. I., Sankey, J. C., Krivorotov, L N., Emley, N. C., Schoelkopf, R. J., Buhrman, R. A., and Ralph, D. C., "*Microwave oscillations of a nanomagnet driven by a spin-polarized current*", Nature, 425, 380 (2003)). The use of the effect of the generation of sustained magnetic excitations in a magnetoresistive device makes it possible to convert this effect into a modulation of electrical resistance directly usable in electronic circuits. The patent applications U.S. Pat. No. 5,695,864 and EP1 860 769 describe various developments implementing the physical principle mentioned here above. They describe especially the precession of the magnetization of a magnetic layer crossed by a spin-polarized electrical current. The physical principles implemented as well as the terminology used are also described and defined in the patent application FR2 892 871.

The oscillation frequency of these radiofrequency oscillators is adjusted by playing on the intensity of the current that goes through them and additionally, if necessary, on an external magnetic field.

Since these radiofrequency oscillators are known, only the elements needed for an understanding of the working of the demodulator 2 are described in greater detail.

The oscillator 22 comprises a magnetoresistive device 40. This device 40 is formed by a stack of magnetic and non-magnetic layers. This stack may form:
a tunnel junction also known as a TMR (tunnel magnetoresistance) junction, or
a spin valve also known as GMR (giant magnetoresistance) spin valve.

Here, the device 40 is described in the particular case where the stack forms a tunnel junction. To this end, the stack comprises at least the following layers:
an input electrode 42 into which there is injected a direct electrical current $I_d$,
a magnetic layer 44 called a "reference layer" that is capable of spin-polarizing the electrical current injected into the electrode 42, and the magnetization of which has a fixed direction,
a magnetic layer 46, called a "free layer", the magnetization of which can oscillate when it is crossed by the spin-polarized current,
a non-magnetic layer 48, called a spacer, interposed between the two preceding layers to create the tunnel junction, and
an output electrode 50 at which the oscillating signal s(t) is produced.

To obtain a high current density, the cross-section of at least one of the layers of the stack typically has a diameter of less than 300 nm and preferably less than 200 or 100 nm. When the cross-section is not a disk, the term "diameter" must be understood to mean "hydraulic diameter". Typically, the term "high" current density designates a current density greater than $10^6$ A/cm$^2$ or $10^7$ A/cm$^2$.

This magnetoresistive device 40 is conformated according to a geometry known as CPP (current perpendicular to plane) geometry. More specifically, in FIG. 2, the magnetoresistive device adopts a structure known as the "nanopillar" structure. In this structure, the layers between the electrodes 42 and 50 have the same horizontal section.

The width L of the different layers forming the pillar is constant. Here, the width L typically ranges from 20 nm to 200 nm.

The electrodes 42 and 50 make it possible to convey the current that crosses the different layers forming the magnetic device perpendicularly to the plane of these layers. The electrode 50 is connected to the electrode 54 by means of a capacitor 51.

The layers 44, 46 and 48 are laid out and conformated so as to enable the appearance of the magnetoresistive properties, i.e. a variation of the resistance of the pillar as a function of the directions of magnetization of the layers 44 and 46.

To improve the readability of FIG. 1, the proportions between the thicknesses of the different layers have not been maintained.

The reference layer 44 is made out of an electrically conductive magnetic material. Its upper face is in direct contact with the spacer 48. It has a direction of easier magnetization contained in the plane of the layer.

The reference layer 44 has the function of spin-polarizing the electrons of the current that cross it. It therefore has a sufficient thickness to achieve this function.

For example, the reference layer 44 is made out of cobalt (Co), nickel (Ni), iron (Fe) and their alloys (CoFe, NiFe, CoFeB . . . etc.). The thickness of the reference layer 44 is of the order of a few nanometers. The reference layer 44 may be laminated by the insertion of a few (typically 2 to 4) very fine layers of copper, silver or gold with a thickness of about 0.2 to 0.5 nm to reduce the spin diffusion length.

Here, the reference layer 44 has a magnetization of fixed direction. The term "magnetization of fixed direction" designates the fact that the direction of the magnetic moment of the reference layer 44 is more difficult to modify than the direction of the magnetic moment of the free layer 46. To obtain this here, the magnetization of the reference layer 44 is trapped by a conductive, anti-ferromagnetic layer 52 interposed between the reference layer 44 and the electrode 42. The upper face of the layer 52 is in direct contact with the lower face of the reference layer 44.

Typically, the thickness of the layer 52 ranges from 5 to 50 nm. It can be made out of a manganese alloy such as one of the following alloys IrMn, PtMn, FeMn, etc. For example, this layer 52 is made out of a material chosen from the group comprising IrMn, FeMn, PtMn, NiMn.

The spacer 48 is a non-magnetic layer. This spacer 48 is thin enough to enable the spin-polarized current to pass from the reference layer 44 to the free layer 46 in limiting polarization loss. Conversely, the thickness of this spacer 48 is great enough to provide for magnetic uncoupling between the layers 44 and 46.

The spacer 48 is made out of an insulating material such as an aluminum oxide or aluminum nitrite, a magnesium oxide, a tantalum nitrite, strontium titanate (SrTiO$_3$), etc. The pillar then has tunnel magnetoresistive or TMR properties and the spacer 48 forms a tunnel barrier. In this case, the thickness of the spacer 48 typically ranges from 0.5 nm to 3 nm.

Here, the tunnel barrier of the device 40 is thin in order to have a low RA factor, i.e. a factor ranging from 0.1 to 20 $\Omega\mu m^2$, and advantageously below 10 or even 5 $\Omega\mu m^2$. The RA factor of a tunnel barrier is the product of the resistance of the tunnel barrier multiplied by its area. Here, the area is the surface area of the cross-section of the tunnel barrier.

Generally, the higher the RA factor of the tunnel barrier, the greater will be the range of variation of the resistivity of the tunnel junction (for example it will be greater than 10%) and the higher will be the sensitivity of the tunnel junction to the precession of the magnetization in the free layer. Typically, for RA factor values of this order, it is generally easy to generate oscillations and it is possible to obtain TMR values of 20% to 150% of the RA factor (typically 80% of the RA factor for an RA factor of 1 $\Omega\mu m^2$), making it possible to obtain high sensitivity of the tunnel junction to the precession of the magnetization in the free layer.

The free layer 46 is an electrically conductive magnetic layer, the magnetization of which can rotate or "precess" more easily than the magnetization of the reference layer 44.

Many embodiments of the free layer are possible. For example, possible embodiments of this free layer are described in the patent application filed under number FR 0 957 888 and in the patent application published under number FR2 892 871.

The lower face of the layer 46 is in direct contact with the upper face of the spacer 48. The upper face for its part is in direct contact with the electrode 50. This layer 46 is made for example out of a ferromagnetic material such as cobalt, nickel or iron or an alloy of these different metals (for example CoFe, CoFeB, NiFe, etc.).

In the absence of spin-polarized current and of any external magnetic field, the direction M of the total magnetic moment of the layer 46 is oriented in parallel to the plane of this layer. The direction M then corresponds to the direction of easiest magnetization of the free layer.

Typically, this stack of layers is made on the upper face of a substrate not shown herein.

The device 40 works as a spin transfer oscillator or STO when the intensity of the spin-polarized direct current $I_d$ crosses a threshold $I_c$ known as a "critical current of oscillations". When the intensity of the current $I_d$ crosses this threshold $I_c$, the magnetization of the free layer of the device 40 precesses sustainedly. The signal s(t) then oscillates at the free frequency $f_{lo}$. Typically, the threshold $I_c$ corresponds to a current density greater than $10^7$ A/cm$^2$ in the cross-section of the layers of the stack. If not, the device 40 behaves like a resonator also known as an STR (spin transfer resonator), and the oscillating signal generated is dampened and not sustained. However, even in this case, to generate the dampened oscillating signal, the current density in the cross-section of the layers of the stack must be high.

To generate the direct current $I_d$, the oscillator 22 has a direct current source 60. In this embodiment, the source 60 generates a direct current $I_d$ the intensity of which is above the threshold $I_c$.

To set the free frequency $f_{lo}$ of oscillation of the signal s(t) generated by the device 40, here the oscillator 22 is also equipped with a generator 70 of a continuous or constant magnetic field $H_b$. This generator 70 is laid out relatively to the device 40 in such a way that these lines of the magnetic field $H_b$ cross the free layer 46. For example, this generator 70 takes the form of two conductive tracks 72 and 73 powered with the direct current, respectively $I_{cm1}$ and $I_{cm2}$, by respective current sources 78 and 79. Each conductive track 72, 73 creates a continuous or constant magnetic field, respectively $H_{b1}$ and $H_{b2}$. The field $H_b$ is the resultant of the superimposition of these two magnetic fields $H_{b1}$ and $H_{b2}$. The tracks 72, and 73 are aligned along different directions so that the fields $H_{b1}$ and $H_{b2}$ are not parallel. Thus, by playing on the intensity of the currents $I_{cm1}$ and $I_{cm2}$ it is possible to modify the direction of the continuous magnetic field $H_b$. For example, here, the tracks 72 and 73 extend along two orthogonal directions situated in a plane parallel to the layers of the device 40.

Each track 72, 73 is placed in proximity to the stack of the layers of the device 40. For example, the tracks 72 and 73 are laid out relatively to the layer 46 so that the lines of the magnetic fields $H_{b1}$ and $H_{b2}$ generated are respectively parallel and perpendicular to the direction M of easier magnetization of the layer 46. Preferably, to limit the electrical consumption of the generator 70, the shortest distance between each conductive track 72, 73 and the free layer 46 is around 100 µm and advantageously smaller than 10 µm, or even 1 µm. In FIG. 3, the resistivity of each track 72, 73 is represented by a respective resistor 74, 75. For example, the value of the resistors 74, 75 is equal to 10Ω and corresponds to the resistance of the conductive track between the output of the current source and a reference potential such as ground.

This generator 70 has two summing elements 80, 81 of which:
one input is connected to the synchronization terminal 20 by means of an amplifier 86, and
the other input is directly connected to the output respectively of the sources 78 and 79 of direct current.

The outputs of the summing elements 80, 81 are directly connected respectively to the tracks 72 and 73. This makes it possible to generate, in addition to the magnetic field $H_b$, an alternating magnetic field $H_a$, the frequency of which is equal to that of the signal $s_0(t)$.

The oscillation frequency of the oscillator 22 is denoted as $f_r$. When there is no signal at the terminal 20, this frequency $f_r$ is equal to the free frequency $f_{lo}$ of oscillation of the oscillator 22. The free frequency is a function of the field $H_b$ and of the intensity of the current $I_d$. When an oscillating signal is received at the terminal 20, the oscillator 22 can get synchronized with this oscillating signal. When the oscillator 22 is synchronized, it produces an oscillating signal s(t) which oscillates in phase with the signal received at the terminal 20. Furthermore, when it is synchronized, the frequency $f_0$ of the signal s(t) produced at the electrode 50 becomes equal to $\alpha f_0$, where:
$f_0$ is the frequency of the signal received at the terminal 20, and
$\alpha$ is a rational number written in the form of a fraction M/P, where M and P are non-zero positive integers.

M can be a natural integer greater than or smaller than P. M and P can also be equal to one.

At this stage, it will be noted that not all the values of a are possible. In reality, only certain particular values of a are possible. On this subject, the following article may be referred to:

Sergei Urazhdin and Phillip Tabor, "*Fractional synchronization of spin-torque nano-oscillators*", Physical Review Letters, PRL 105, 104101, 3 Sep. 2010.

The possible values of a are for example determined experimentally by causing the free frequency $f_{lo}$ to vary and by injecting, at the terminal 20, a signal of a frequency constantly equal to the frequency $f_0$. To modify the free frequency $f_{lo}$, it is possible to modify the intensity of the magnetic field $H_b$ and/or the intensity of the current $I_d$. This therefore amounts here to modifying the intensity of the current $I_d$ and/or the intensity of the current $I_{cm}$. Indeed, it is known that the free frequency $f_{lo}$ depends on the intensity of the magnetic field $H_b$ which crosses the free layer and the intensity of the direct current $I_d$. For example, the free frequency $f_{lo}$ can be estimated by means of the following relationship:

$$\omega(H_b, I_d) = \omega_o(H_b) + Np(I_d) \quad (1),$$

where:
$\omega(H_b, I_d)$ is the pulsation of the free frequency $f_{lo}$, i.e. $2\pi f_{lo}$.
$\omega_o(H_b)$ is the pulsation of the oscillator 22 caused by the magnetic field $H_b$,
N is an experimentally determinable constant, and
$p(I_d)$ is the amplitude of the oscillations of the signal s(t) as a function of the intensity of the current $I_d$.

The pulsation $\omega_o(H_b)$ can be given by Kittel's law. For example, when the magnetic field $H_b$ generated by the generator 70 is parallel to the axis of easier magnetization of the free layer 46, then the pulsation $\omega_o(H_b)$ is given by the following relationship:

$$\omega_o(H_b) = (\gamma_o 2\pi)(H_b(H_b + 4\pi M_s))^{1/2} \quad (2)$$

where:

$\gamma_o$ is equal to about 2.82 MHz/Oe, $\pi$ is the symbol for "pi" radians, and $4\pi M_s$ is the magnetization at saturation (about 16.000 Oe for a layer made of CoFeB).

The unit "Oe" is an oersted ($=10^3/(4)$ A/m or about 80 A/m).

For example, by causing the intensity of the field $H_b$ to vary from 1 Oe to 5 kOe, the free frequency $f_{lo}$ is made to vary from 356 MHz to 29 GHz. Preferably, here, the field $H_b$ is made to vary from 50 Oe to 1.2 kOe, which corresponds to a variation of the free frequency $f_{lo}$ of 2 GHz to 13 GHz. In the case of the generator 70, the intensity of the magnetic field $H_b$ is modified by causing the intensity of the current $I_{cm}$, to vary.

In the relationship (1), N is a constant in hertz which is proper to the magnetoresistive device 40. It can be determined experimentally. For example, the evolution of the free frequency $f_{lo}$, as a function of the intensity of the current $I_d$ for oscillations of the magnetization of the free layer in its plane, is measured. From these measurements, the constant N can be computed. Typically, it is of the order of some GHz. For example, here $N/2\pi=7.5$ GHz.

If the oscillations of the magnetization of the free layer are not included in its plane, the constant $N/2\pi$ is typically greater than 20 GHz.

Further explanations on the relationships linking the free frequency $f_{lo}$ to the different parameters of the magnetoresistive device can be found in the following article: A. Slavin and V. Tiberkevich, "*Nonlinear auto-oscillator theory of microwave generation by spin-polarized current*" IEEE Transaction on Magnetics, vol n° 45, pp. 1875-1918(2009).

When the oscillator 22 is synchronized, the low-frequency noise, i.e. the power of the oscillations at frequencies below 1 GHz and preferably below á 100 Hz is very small. The term "very small" herein indicates the fact that the power of the low-frequency noise is at least ten times smaller, and preferably 30 times smaller, than the power of the low-frequency noise measurable when there is no synchronization, i.e. when no signal is received at the terminal 20.

Furthermore, when the oscillator 22 is synchronized, then the phase noise of the oscillator 22 is better than when there is no synchronization. Typically, the phase noise of the oscillator 22 is ten times smaller, and preferably a hundred times smaller, than it is when no signal is received through the terminal 20.

The above information therefore makes it possible to determine several possible values of $\alpha$. Here below in the description, the values of $\alpha$ are only those for which a synchronization is possible. For example, generally the possible values of $\alpha$ are greater than or equal to 1.2 or smaller than or equal to 0.8. Preferably, the possible value of $\alpha$ are greater than or equal to 3/2 or smaller than or equal to 2/3. Typically, the integer numbers different from one are possible values for $\alpha$. By way of an illustration, $\alpha$ is chosen from the group consisting of 1/2; 3/4; 3/2; 5/2; 2; 3; 4 and 7/2.

Here, the conditions of operation of the oscillator 22 are set so that it is capable of getting synchronized with the signal $s_0(t)$. The conditions of operation are defined as being the values of the intensity of the current $I_d$ and the intensity and the direction of the field $H_b$.

In this embodiment, it is desired that, when the oscillator 22 is synchronized with the frequency $f_0$, it should oscillate at the frequency $\alpha f_0$. The coefficient $\alpha$ is chosen to be different from one and preferably strictly smaller than one. Preferably, $\alpha$ is chosen from the group consisting of 1/2 and 3/4. To this end, the current $I_d$ and the field $H_b$ are set so that the free frequency $f_{lo}$ of oscillation is close to the frequency $\alpha f_0$. To this end, here, the intensity of the currents $I_d$, $I_{cm1}$ and $I_{cm2}$ are set so that the free frequency $f_{lo}$ is equal to $\alpha f_0$. The setting can be done for example:

by fixing the intensity of the current $I_d$ just above the threshold $I_c$, then determining, by means of the relationship (2), the magnetic field $H_b$ which gives a free oscillation frequency equal to $\alpha f_0$, and finally determining the intensities of the currents $I_{cm1}$ and $I_{cm2}$ which makes it possible to obtain this field $H_b$ in the free layer 46.

The distribution of the current between the lines 72 and 73 is chosen as a function of the coefficient $\alpha$ desired. Indeed, the direction of the field $H_b$ modifies the possible coefficients $\alpha$.

The synchronization takes place for oscillations at the terminal 20 at the frequency $f_0$ but also for oscillations at the terminal 20 at frequencies close to the frequency $f_0$. In other words, the oscillator 22 gets synchronized with all oscillations for which the frequency belongs to a range $[f_0-\delta_0; f_0+\delta_0]$. In the present case, the width $2\delta_0$ of this range should be big enough to enable the oscillator 22 to get synchronized with oscillations of frequency $f_0$ but also with oscillations of frequencies close to $f_0 \pm k f_{ref}$ where k is a natural integer. The width of this range increases when the amplitude of the electrical signal $s_0(t)$ increases. Consequently, here, the amplifier 86 is adjusted so that the difference $\delta_0$ is great enough for the frequencies $f_r \pm k f_{ref}$ to belong to the range $[f_0-\delta_0; f_0+\delta_0]$, whatever the value of k belonging to [0; 30] and preferably to [0; 100]. For example, the amplitude of the signal $s_0(t)$ is amplified until this amplitude corresponds to an intensity of the alternating magnetic field $H_a$, within the free layer 76, that is at least greater than 1 Oe and preferably greater than 10 Oe.

The graphs of FIGS. 4 and 5 illustrate the characteristics of a particular embodiment of the device 40. The curve 90 of the graph of FIG. 4 represents the progress of the free frequency $f_{lo}$ of the oscillator 22 as a function of the intensity of the current $I_d$ when the field $H_b$ is constantly equal to 600 Oe.

The curve 92 of the graph of FIG. 5 represents the progress of the free frequency $f_{lo}$ of the oscillator 22 as a function of the intensity of the continuous magnetic field $H_b$ when the intensity of the current $I_d$ is constantly equal to −0.75 mA.

As shown in the graphs of FIGS. 4 and 5, the oscillator 22 is herein essentially capable of oscillating at a frequency $f_{lo}$ of 3 to 10 GHz.

The working of the synthesizer 2 shall now be described with reference to the method of FIG. 6.

At a step 100, the electronic control unit 16 receives instructions to set the frequency $f_t$.

At a step 102, the electronic control unit 16 sets the synthesis stage 8 and the radiofrequency oscillator 22 to obtain the frequency $f_t$ corresponding to the instructions received at the control terminal 18. For example, at this step, the electronic unit 16 uses a pre-recorded table associating, with each desired frequency $f_t$, corresponding values for setting the stage 8 and the oscillator 22. More specifically, the setting of the stage 8 consists in obtaining a variation of the factor n of the frequency divider 32. Consequently, the frequency $f_0$ is modified so as not be equal to the frequency $f_{ref}$ of the clock 24. The setting of the oscillator 22 consists in adjusting the intensity of the currents $I_d$, $I_{cm1}$ and $I_{cm2}$ so that the free frequency $f_{lo}$ is equal to $\alpha f_0$. Furthermore, the intensity of the current $I_d$ is chosen to be greater than or equal to the intensity of the critical current $I_c$ so that the magnetoresistive device 40 oscillates in a sustained manner.

At this step 102, if necessary, the direction of the magnetic field $H_b$ is also set by playing on the distribution of the current between the lines 72 and 73.

At a step 104, the amplifier 86 is also set by the electronic control unit so that the difference $\delta_0$ is great enough to enable the synchronizing of the oscillator 22 on a wide range of frequencies [$f_0-\delta_0$; $f_0+\delta_0$] around the frequency $f_0$.

Then, at a step 106, the first stage 8 generates a signal $s_0(t)$ at the frequency $f_0$. This signal is injected into the terminal 20 for synchronizing the oscillator 22.

At a step 108, the oscillator 22 gets synchronized with the signal $s_0(t)$. Under these conditions, it renders the signal $s_r(t)$, at the terminal 4, at the frequency $\alpha f_0$, i.e. at the frequency $f_r$.

The method can return to the step 100 to modify the frequency $f_r$.

FIG. 7 shows an oscillator 120 capable of being used instead of the oscillator 22. This oscillator 120 is identical to the oscillator 22 except that the generator 70 is replaced by a generator 122 and the generator 60 is connected to the input electrode 42 by means of a summing element 124.

The generator 122 is identical to the generator 70 except that the summing elements 80, 81, the current source 79 and the track 23 are omitted. Thus, in this embodiment, the synchronization with the signal $s_0(t)$ is not done by means of an alternating magnetic field. In this embodiment, the magnetic field $H_b$ is constant.

The summing element 124 possesses one input directly connected to the output of the direct current generator 60 and another input directly connected to the synchronization terminal 20 by means of an amplifier 86. One output of this summing element 124 is directly connected to the electrode 42. Consequently, this summing element 124 adds the signal $s_0(t)$ to the direct current $I_d$. Thus, when the oscillator 120 is used instead of the oscillator 22, the synchronization of the oscillator with the frequencies $f_0$ is done by injecting the electrical signal $s_0(t)$ into the electrode 42.

The working of the synthesizer 2 when it is equipped with the oscillator 120 can be deduced from the explanations given here above in the case of the oscillator 22. In particular, in order that the synchronization of the oscillator 120 with the signal $s_0(t)$ can occur, it is necessary to set the intensities of the currents $I_d$ and $I_{cm}$ as described here above. It is also necessary that the amplitude of the current $s_0(t)$ should not be negligible as compared with the intensity of the current $I_d$. To this end, the amplifier 86 is set so that the amplitude of the current $s_0(t)$ is at least greater than 10% of the intensity of the current $I_d$.

FIG. 8 shows a synthesizer 140 of a signal $s_r(t)$ oscillating at a frequency $f_r$. This synthesizer 140 is identical to that of FIG. 1 except that the radiofrequency oscillator 22 is replaced by several radiofrequency oscillators parallel connected between the output terminal of the first stage 8 for the synthesizing the signal $s_0(t)$ and the rendering terminal 4.

To simplify the figure, only three radiofrequency oscillators 142 to 144 are shown.

Here, each radiofrequency oscillator 142 to 144 is set so as to synchronize with the signal $s_0(t)$. Each of the oscillators 142 to 144 is also configured to oscillate at a frequency $f_r$ different from those of the others when it is synchronized with the signal $s_0(t)$. This configuration can be done by setting the intensities of the currents $I_d$, $I_{cm1}$ and $I_{cm2}$ differently. This difference in configuration can also be obtained by using different magnetoresistive devices for each radiofrequency oscillator 142 to 144.

In this embodiment, the configuration of each radiofrequency oscillator is fixed once and for all during manufacture. Thus, the setting terminals of these oscillators are omitted.

The synthesizer 140 also has a set 148 of controllable switches. This set 148 herein has three switches 150 to 152. The switches 150 to 152 are connected between the rendering terminal 4 and, respectively, the output electrodes of the oscillators 142 to 144.

Each switch 150 to 152 switches over between:

a shut position in which it electrically connects the output electrode of the oscillator to the terminal 4, and an open position in which it electrically isolates the output electrode from the terminal 4.

In this embodiment, the setting terminal of the first synthesis stage 8 has been omitted. Thus, the stage 8 always generates a signal $s_0(t)$ at the same frequency $f_0$.

The electronic control unit 16 is replaced by a simplified controlled circuitry 160. Indeed, this electronic control unit 160 controls only the set of switches 150 to 152. More specifically, depending on instructions received at a control terminal 162, the electronic unit 160 connects the output electrode of the radiofrequency oscillator which generates the signal $s_r(t)$ having the frequency corresponding to the instructions received at the rendering terminal 4. Thus, in this embodiment, it is possible to modify the frequency $f_r$ of the signal $s_r(t)$ without in any way modifying the conditions of operation of one of the radiofrequency oscillators 142 to 144.

Many other embodiments are possible. For example, the frequency $f_0$ can be strictly smaller or strictly greater than the frequency $f_r$.

The electronic control unit can be omitted if the frequency $f_r$ does not have to be made to vary. Thus, the frequency synthesizer is configured once and for all during its manufacture to generate the signal $s_r(t)$ at the frequency $f_r$. Thus, preferably, the coefficient $\alpha$ is strictly smaller than one or 0.8.

The line 73 and the source 79 of direct current of the generator 70 can be omitted. In this case, it is no longer possible to adjust the direction of the continuous field $H_b$.

It is not necessary for the frequency $f_0$ to be capable of being set. In this case, the setting terminal 10 can be omitted.

The generator of the magnetic field $H_b$ can be distinct from that which generates the field $H_a$.

It is not necessary for the free frequency $f_{lo}$ to be strictly equal to $f_r$. As a variant, the intensities of the currents $I_d$ and $I_{cm}$ where $I_{cm1}$ and $I_{cm2}$ are set so that the frequency $f_{lo}$ is equal to the frequency $f_r$ to within plus or minus 60%, and preferably to within plus or minus 45 or 30 or 10%.

In the embodiment of FIG. 8, the synchronization terminal for synchronizing the radiofrequency oscillators 142 to 144 can be connected solely when this is necessary at the output of the first stage 8.

Many other embodiments of the magnetoresistive device 40 are possible. For example, the direction of easier magnetization of the free layer and/or of the reference layer are not necessarily contained in the plane of the layer. For example, the direction of easiest magnetization can be perpendicular to the plane of the layer.

It is also possible for the layer 44 to be a multilayer, for example an SyF (synthetic ferrimagnetic) or even an SAF (synthetic antiferromagnetic) multilayer. This makes it possible to trap the direction of magnetization of this layer without its being necessary to use a complementary anti-ferromagnetic layer for this. The layer 52 can therefore be omitted in this case.

The spacer 48 can be made out of an electrically conductive material such as copper (Cu). The magnetoresistive properties of the pillar are then called giant magnetoresistance or GMR properties.

One (or more) polarizers can also be used to make the magnetoresistive device in addition to the reference layer. A polarizer is a magnetic layer or multilayer, the magnetization of which is outside the plane of the layer and, for example, perpendicular to the plane of the layer. The polarizer makes it possible to spin-polarize the current that crosses it. Typically, the polarizer is formed by several sub-layers superimposed on one another, for example an alternation of magnetic and metallic layers (for example $(Co/Pt)_n$). Here, the polarizer is not described in greater detail. For further information on polarizers, reference may be made to the patent application FR2 817 998. The presence of the polarizer makes it possible to obtain a precession of the magnetization of the free layer outside its plane. This enables for example making the oscillator work in a null field, i.e. in the absence of any static external magnetic field. For example, a polarizer is directly deposited on the electrode 42. Thus, in the embodiment of FIG. 8, the magnetic field generator 122 can be omitted, for example, if a polarizer is used.

The magnetic field generator 70 can be made differently. For example, the magnetic field $H_b$ can be generated by a magnetized layer situated in proximity to the free layer.

The magnetic field $H_b$ can be parallel or perpendicular to the direction of easier magnetization of the free layer. It can also form any unspecified angle with this direction of easier magnetization. The choice of this angle modifies the possible values of the coefficient The synthesizers described here can be used as frequency modulators. In this case, the instructions received at the control terminal 10 depend on a piece of information to be transmitted.

The invention claimed is:

1. An apparatus comprising a synthesizer for synthesizing a synthesized signal oscillating at a synthesized-signal frequency, said synthesizer comprising a first frequency-synthesizing stage configured for generating, at an output terminal thereof, an intermediate signal oscillating at an intermediate frequency, said first frequency-synthesizing stage comprising a phase-locked loop, a rendering terminal for rendering said synthesized signal, a second frequency-synthesizing stage comprising a radio-frequency oscillator, said radio-frequency oscillator comprising a magnetoresistive device within which there flows a spin-polarized electrical current to generate said synthesized signal on an output electrode connected to said rendering terminal, said magnetoresistive device being formed by a stack of magnetic and non-magnetic layers, a synchronization terminal for synchronizing said frequency of said synthesized signal with said frequency of said signal received at said synchronization terminal, said synchronization terminal being connected to said output terminal of said first frequency-synthesizing stage to receive said intermediate signal, and at least one of a current source to cause a continuous current of electrons to flow perpendicularly through said layers and a magnetic field generator capable of generating a continuous magnetic field having field lines that cross a free layer of said magnetoresistive device with an intensity greater than or equal to 1 oersted, said at least one of a current source and a magnetic field generator being set so that said radio-frequency oscillator oscillates at a scaled frequency when said oscillator is synchronized with said intermediate signal, said scaled frequency being said intermediate frequency scaled by a scaling factor that is a positive rational number different from 1 such that said scaled frequency is equal to said synthesized-signal frequency, and at a free frequency within ±60% of being equal to said synthesized-signal frequency in the absence of a signal at said synchronization terminal of said radio-frequency oscillator.

2. The apparatus of claim 1, wherein said first frequency-synthesizing stage is configured to generate an intermediate signal oscillating at an intermediate frequency strictly greater than said synthesized-signal frequency.

3. The apparatus of claim 1, wherein said first frequency-synthesizing stage is configured to generate an intermediate signal oscillating at a frequency greater than or equal to twice said synthesized-signal frequency.

4. The apparatus of claim 1, wherein said synthesizer further comprises an electronic control unit capable of modifying a setting of said at least one of a current source and a magnetic field so that said frequency of said synthesized signal when said radio-frequency oscillator is synchronized with said intermediate signal passes from a first scaled frequency to a second scaled frequency, where said first and second scaled frequencies are obtained by scaling said intermediate frequency with different rational numbers.

5. The apparatus of claim 1, wherein said second frequency-synthesizing stage comprises a plurality of radio-frequency oscillators having synchronization terminals connected to said output terminal of said first frequency-synthesizing stage to receive said intermediate signal, each of said radio-frequency oscillators being configured to oscillate at a free frequency in the absence of a signal at said synchronization terminal, said free frequency being different from free frequencies of other radio-frequency oscillators so that, when synchronized with said intermediate signal, said radio-frequency oscillator produces a synthesized signal that oscillates at a scaled frequency, said scaled frequency being obtained by scaling said intermediate frequency by a scale factor particular to radio-frequency oscillator, and a set of controllable switches capable of connecting an output electrode of any one of said radio-frequency oscillators with said rendering terminal, and an electronic control unit capable of responding to instructions received at a control terminal for controlling said set of switches to connect said rendering terminal to an output electrode of said radio-frequency oscillator or oscillators which produce a signal oscillating at a synthesized-signal frequency corresponding to said instructions received.

6. The apparatus of claim 1, wherein said magnetoresistive device comprises an input electrode by which said direct electrical current is injected, a reference layer capable of spin-polarizing said electrical current, said reference layer having a magnetization along a fixed direction, a free layer having a magnetization that can oscillate when crossed by said spin-polarized current, a non-magnetic spacer layer interposed between said free layer and said reference layer to form one of a tunnel junction and a spin valve, and an output electrode for outputting a signal oscillating at an oscillation frequency that is a function of one of intensity of said direct current and amplitude of a continuous magnetic wave having magnetic field lines crossing said free layer, wherein a cross-section of at least one of said layers of said stack has a diameter of less than 300 nm.

7. The apparatus of claim 6, wherein said magnetic field generator is capable of modifying a direction of said continuous magnetic field as a function of a command, and said synthesizer comprises an electronic control unit capable of generating said command as a function of a value of said synthesized-signal frequency, said synthesized-signal frequency being selectable by a user.

8. A method for synthesizing a synthesized signal oscillating at a synthesized-signal frequency, said method comprising at an output terminal of a first frequency synthesizing stage having a phase-locked loop, generating an intermediate signal oscillating at an intermediate frequency, at a rendering terminal, rendering said synthesized signal, synchronizing a radio-frequency oscillator with said intermediate signal, said radio-frequency oscillator comprising a magnetoresistive device within which there flows a spin-polarized electrical current to generate said synthesized signal on an output electrode connected to said rendering terminal, said magnetoresistive device being formed by a stack of magnetic and non-magnetic layers, a synchronization terminal for synchronizing a frequency of said synthesized signal with a frequency of said signal received at said synchronization terminal, said synchronization terminal being connected to said output terminal of said first frequency-synthesizing stage to receive said intermediate signal, and at least one of a direct current source to cause a continuous current of electrons to flow perpendicularly through said layers and a continuous magnetic field generator capable of generating a continuous magnetic field having field lines that cross a free layer of said magnetoresistive device with an intensity greater than or equal to 1 oersted, said at least one of a direct current source and a continuous magnetic field generator being configured to cause said radio-frequency oscillator to oscillate at a scaled frequency when said radio-frequency oscillator is synchronized with said intermediate signal, said scaled frequency being obtained by scaling said intermediate frequency by a positive rational number different from 1 such that said scaled frequency is equal to said synthesized signal frequency, and at a free frequency that is within ±60% of being equal to said synthesized signal frequency in the absence of a signal at said synchronization terminal.

9. The method of claim 8, further comprising setting at least one of a direct current and a continuous magnetic field so that said free frequency is within ±45% of being equal to said synthesized-signal frequency.

10. The method of claim 9, further comprising amplifying said intermediate signal such that an amplitude thereof at said synchronization terminal is greater than 10% of an intensity of said direct current or corresponds to an alternating magnetic field having an intensity greater than 1 oersted within said free layer when said current is converted into a magnetic field by said continuous magnetic field generator.

* * * * *